(12) United States Patent
Handforth et al.

(10) Patent No.: US 7,348,494 B1
(45) Date of Patent: Mar. 25, 2008

(54) SIGNAL LAYER INTERCONNECTS

(75) Inventors: Martin R. Handforth, Kanata (CA);
Herman Kwong, Kanata (CA);
Richard R. Goulette, Arnprior (CA)

(73) Assignee: Nortel Networks Limited (CA)

( * ) Notice: Subject to any disclaimer, the term of this patent is extended or adjusted under 35 U.S.C. 154(b) by 5 days.

(21) Appl. No.: 09/821,722

(22) Filed: Mar. 29, 2001

Related U.S. Application Data

(60) Provisional application No. 60/255,383, filed on Dec. 15, 2000.

(51) Int. Cl.
*H05K 1/16* (2006.01)
(52) U.S. Cl. .................. 174/260; 361/761; 257/695
(58) Field of Classification Search ............. 174/254, 174/261, 255, 256, 260; 439/65, 74, 78; 257/694, 695, 735, 736; 361/761–764
See application file for complete search history.

(56) References Cited

U.S. PATENT DOCUMENTS

| | | | | | |
|---|---|---|---|---|---|
| 3,579,206 | A | * | 5/1971 | Grange | ................ 174/117 FF |
| 3,702,500 | A | * | 11/1972 | Gorinas et al. | ............. 174/253 |
| 5,136,471 | A | * | 8/1992 | Inasaka | ...................... 174/255 |
| 5,209,671 | A | * | 5/1993 | Sugimoto et al. | ............. 439/67 |
| 5,219,292 | A | * | 6/1993 | Dickirson et al. | ............. 439/67 |
| 5,408,052 | A | * | 4/1995 | Inaba et al. | .................... 174/254 |
| 5,452,182 | A | * | 9/1995 | Eichelberger et al. | ...... 174/254 |
| 5,620,782 | A | * | 4/1997 | Davis et al. | .................... 174/255 |
| 5,767,575 | A | * | 6/1998 | Lan et al. | ...................... 257/701 |
| 5,767,623 | A | * | 6/1998 | Friedman et al. | ............. 174/261 |
| 5,917,707 | A | * | 6/1999 | Khandros et al. | ............ 361/776 |
| 6,061,246 | A | * | 5/2000 | Oh et al. | ........................ 174/254 |
| 6,246,112 | B1 | * | 6/2001 | Ball et al. | ....................... 257/690 |
| 6,274,225 | B1 | * | 8/2001 | Miyake et al. | ............... 174/254 |
| 6,280,828 | B1 | * | 8/2001 | Nakatsuka et al. | .......... 174/254 |
| 6,384,339 | B1 | * | 5/2002 | Neuman | ...................... 174/254 |
| 6,608,258 | B1 | * | 8/2003 | Kwong et al. | ............... 174/258 |

* cited by examiner

*Primary Examiner*—Jeremy C Norris
(74) *Attorney, Agent, or Firm*—McGuinness & Manaras LLP

(57) ABSTRACT

Inner layer traces on a multilayer printed wiring board are exposed to enable direct interconnection with another device such as a printed wiring board. The traces may be exposed by removing at least some of the dielectric substrate material around the traces, or by extending the traces beyond the other layers of the printed wiring board. Corresponding conductors associated with the other device are placed in direct physical contact with the exposed inner layer traces, and may be aligned and secured with guide plates, alignment pins and spring members. Such direct connection mitigates the need for vias, and has more favorable electrical characteristics for high frequency signal transmission.

12 Claims, 12 Drawing Sheets

SIGNAL LAYER INTERCONNECTS

CROSS-REFERENCE TO RELATED APPLICATIONS

A claim of priority is made to U.S. Provisional Patent Application No. 60/255,383, entitled Implementation of Connection of High frequency Digital Signals, by Martin R. Handforth, et al., filed 15 Dec. 2000, which is incorporated by reference.

FIELD OF THE INVENTION

The present invention relates generally to electrical connectors, and more particularly to electrical interconnect technology for high frequency transmission.

BACKGROUND OF THE INVENTION

Impedance matching problems associated with use of mechanical connectors for connecting conductive traces are known. For example, the present state of the art in electrical connector technology involves the use of vias, which are holes plated with metal, to connect signal layers in multi-layer substrates. When used with high-frequency signals such as digital signals, vias contribute to problems such as impedance mismatches and cross-talk to adjacent signal layers. The extent of the problem depends upon the type of via used and related size and material characteristics.

The high frequency performance of vias depends mainly on a number of geometric features such as length of the plated-through hole, and diameter of the plated-through hole. The high frequency performance of vias further depends on the dielectric constant of the substrate dielectric layers. Other features that impact the high frequency performance of vias include the number, size, and shape of metallic pads used on the via and the number, size, and shape of the clearance holes, also called antipads, used where the plated-through hole must penetrate the metal reference planes (e.g., ground or power planes).

In view of the foregoing, it would be desirable to provide a technique for connecting signal layers in a multi-layer substrate which overcomes the above-described inadequacies and shortcomings. More particularly, it would be desirable to provide a technique for connecting signal layers and avoiding impedance mismatching in an efficient and cost effective manner.

SUMMARY OF THE INVENTION

In accordance with the present invention, at least one conductive trace associated with an inner layer of a printed wiring board is exposed to facilitate direct electrical interconnection with a conductor that is associated with another device. Signals carried on the inner layer traces may be transmitted directly to and from the inner layer between boards without use of vias or connectors. In one embodiment, exposed traces on the inner layer terminate near the edge of the printed wiring board. The exposed traces are placed in physical contact with corresponding traces associated with exposed traces at the edge of another printed wiring board associated with a backplane, midplane, flexible interconnect, or other device. The inner layer traces may be exposed by removing at least some of the substrate material between the inner layer traces and the outer layer. Alternatively, the inner layer traces may extend beyond the edge of the surrounding substrate material such that they are exposed for interconnection purposes.

Guide plates, alignment pins and spring members may be employed to facilitate aligning and electrically connecting inner layer traces with corresponding conductors associated with another printed wiring board. Separate guide plates are attached to each printed wiring board. In particular, alignment pins are inserted through holes formed in both the guide plates and the printed wiring board to align and secure the guide plate relative to the printed wiring board. Slots formed in the guide plates receive the alignment pins to provide co-lateral and longitudinal alignment when the printed wiring boards are pushed together. The guide plates may also provide additional stiffness to the substrate and contact pressure between corresponding inner layer traces. The spring members interlock with the alignment pins to push the aligned printed wiring boards and corresponding conductors together and cause the corresponding traces and conductors to wipe against one another as contact is established. Retaining rings may be employed to retain the alignment pins in place.

Protrusions may be formed on the surface of signal layer traces to further facilitate electrical connection with corresponding traces. Signal layer traces are formed in various widths to optimize density and impedance matching. As described above, an array of such traces may be routed to and terminate at the edge of the printed wiring board to enable electrical connection of multiple signals. To mitigate the possibility of connection problems due to warping of the printed wiring board, malleable or resilient conductive protrusions may be disposed on. For example, nickel and gold protrusions may be formed on the contact surface of the signal layer interconnects. The protrusions may be formed on copper traces by pre-cleaning the copper surface, applying at least 0.120" of electroless nickel on the copper, and then applying approximately 0.030" electroless gold on the nickel surface. The protrusions facilitate establishment of electrical connection by deforming slightly against the corresponding trace during the contact wipe motion described above.

Another technique that may be employed to mitigate effects caused by typical printed wiring board irregularities is shaping. For example, the printed wiring board can be modified after being constructed in order to compensate for mild warping. Modification can be both additive and subtractive. That is, material may be added to the printed wiring board or removed from the printed wiring board in order to provide a more uniformly planar shape. The conductive traces employed for interconnection purposes may be employed as a reference to determine shaping of the outer layer substrate. In one embodiment, the outer layer substrate is milled to achieve a predetermined thickness proximate to the edge of the printed wiring board that mates with the guide plate.

One advantage associated with the present invention is the reduction of undesirable electrical characteristics such as parasitic capacitance. Along a conductive path, parasitic electrical characteristics are greatly effected by conductor shape and conductor material. Changes in cross sectional area and direction, such as at edges and corners, are typically associated with impedance matching problems. Similarly, boundaries between materials having different electrical characteristics are typically associated with impedance matching problems. The present invention mitigates changes in cross sectional area and direction of conductors by transmitting signals directly to and from the signal layer with co-lateral and co-longitudinal alignment. Further, impedance matching problems associated with boundaries between the different materials associated with vias are reduced by eliminating the need for some vias altogether.

The present invention will now be described in more detail with reference to exemplary embodiments thereof as shown in the appended drawings. While the present invention is described below with reference to preferred embodiments, it should be understood that the present invention is not limited thereto. Those of ordinary skill in the art having access to the teachings herein will recognize additional implementations, modifications, and embodiments, as well as other fields of use, which are within the scope of the present invention as disclosed and claimed herein, and with respect to which the present invention could be of significant utility.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

DETAILED DESCRIPTION OF EXEMPLARY EMBODIMENTS

Figure 1:
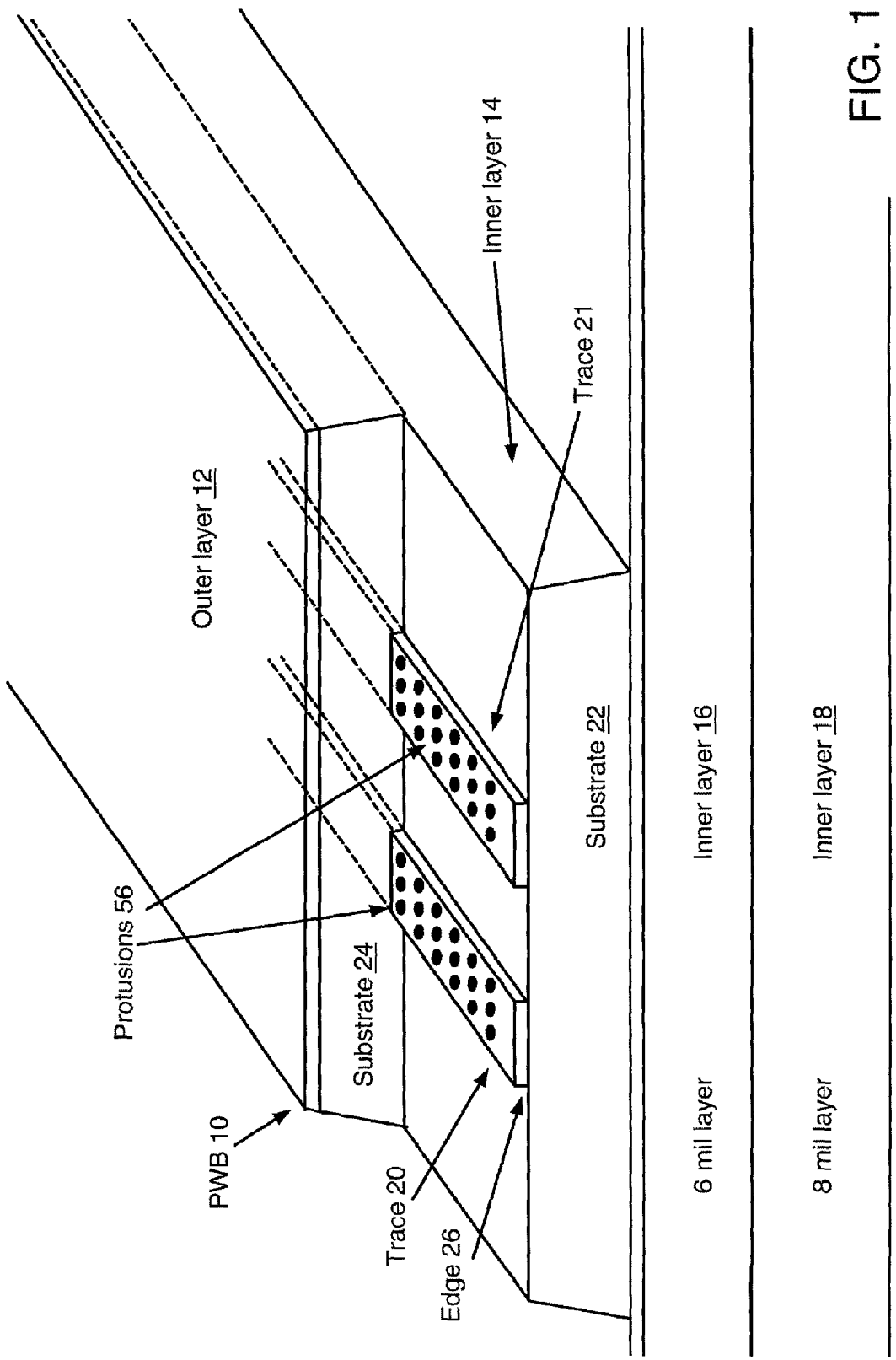
FIG. 1 is a perspective view of a printed wiring board having exposed signal layer traces in accordance with the present invention.

Referring to FIG. 1, a printed wiring board 10 with direct signal layer interconnect capability has multiple layers, including outer layer 12 and inner layers 14, 16, 18. Each layer includes a dielectric portion and a conductive portion. For example, substantially flat conductive copper traces 20, 21 are disposed on dielectric substrate material 22, such as FR4, ceramic, or other materials. Each inner layer is generally dedicated to a single function, such as carrying ground, power or signals. Signal layer traces are formed in various widths to optimize density and impedance matching.

Portions of selected signal layer traces 20, 21 are made directly accessible in order to facilitate electrical connection. In the illustrated example, one end of some of the signal layer traces 20, 21 is exposed by removing the surrounding dielectric substrate material 24 associated with the outer layer 12. The selected signal layer traces 20, 21 terminate near the edge 26 of the printed wiring board and are substantially orthogonal to the edge of the printed wiring board, although any angle could be accommodated. Each exposed trace 20, 21 presents a substantially flat conductive surface near the edge of the printed wiring board.

Figure 2:
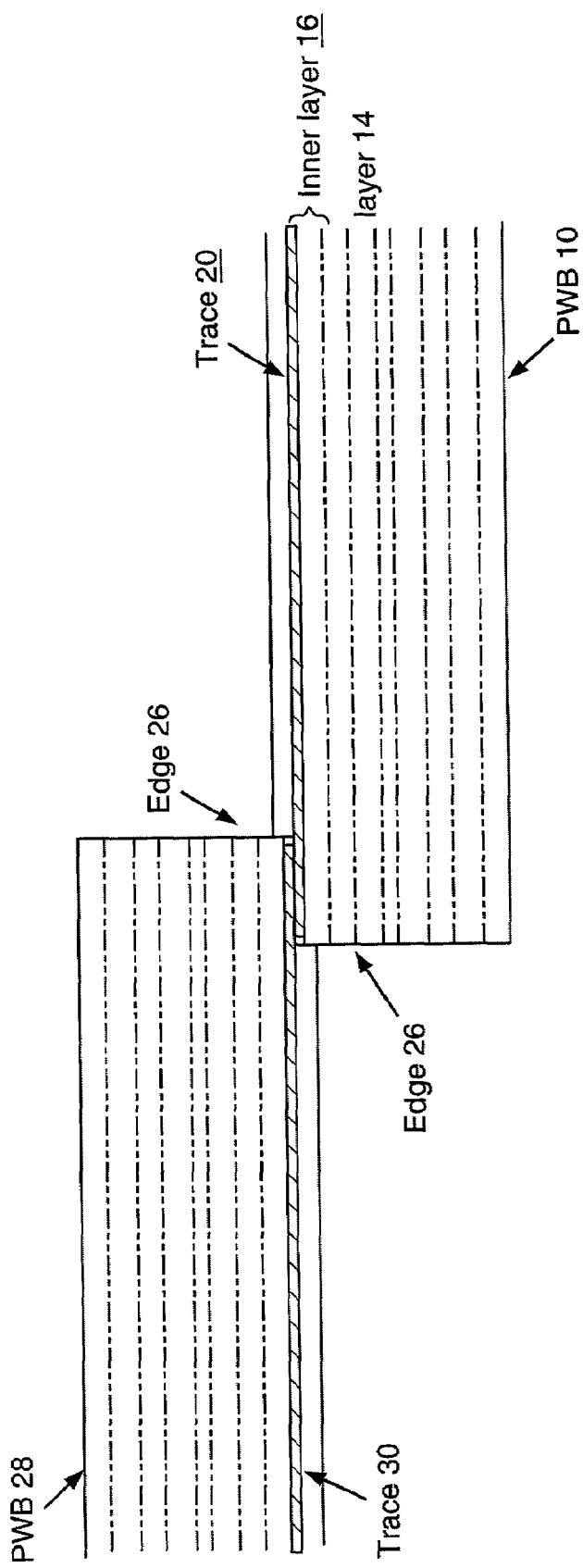
FIG. 2 is a side view of the printed wiring board of FIG. 1 connected with another printed wiring board.
Figure 3:
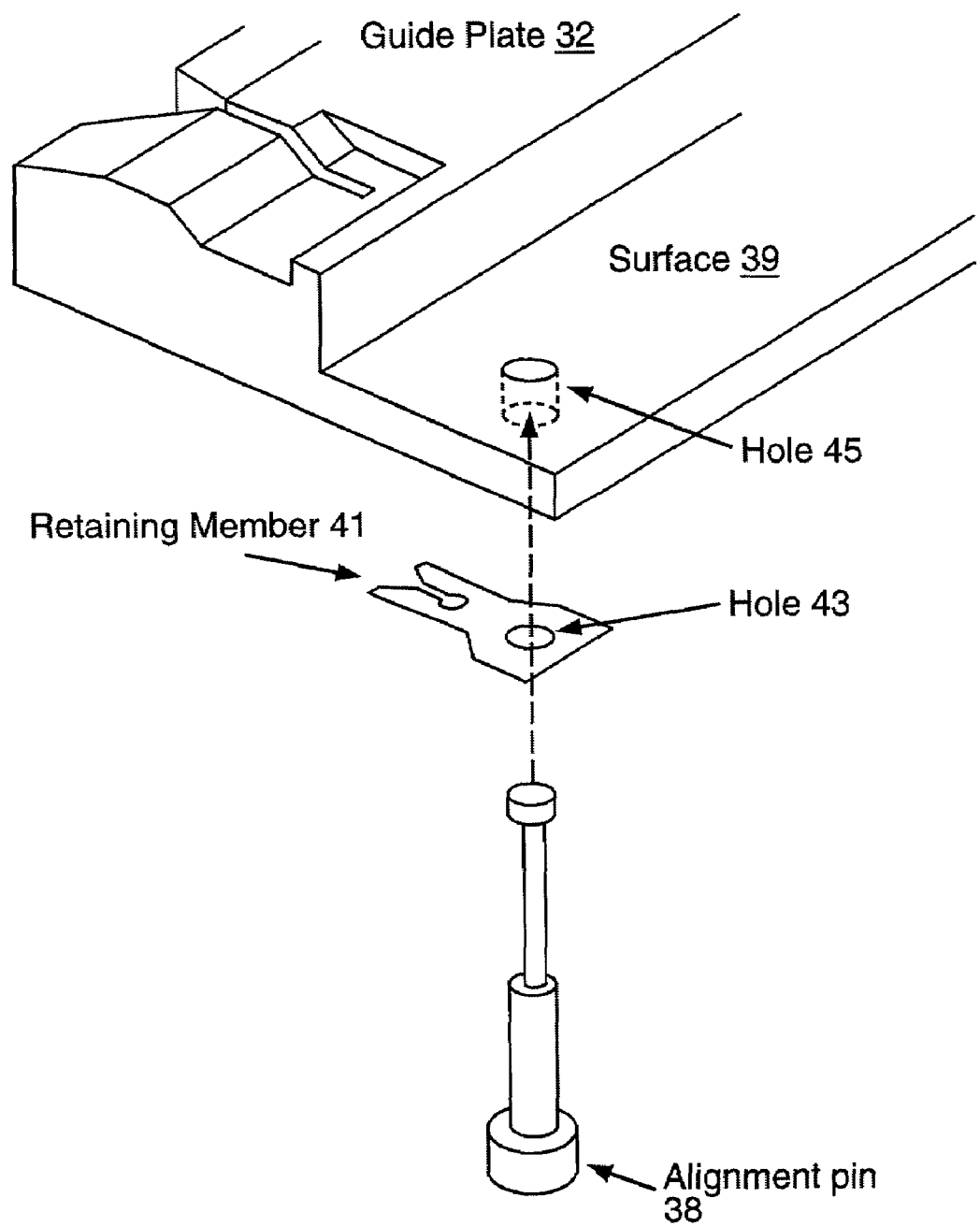
FIGS. 3 through 7 illustrate use of guide plates, alignment pins, spring members, and retaining members to facilitate connection of the printed wiring boards of FIG. 2.
Figure 4:
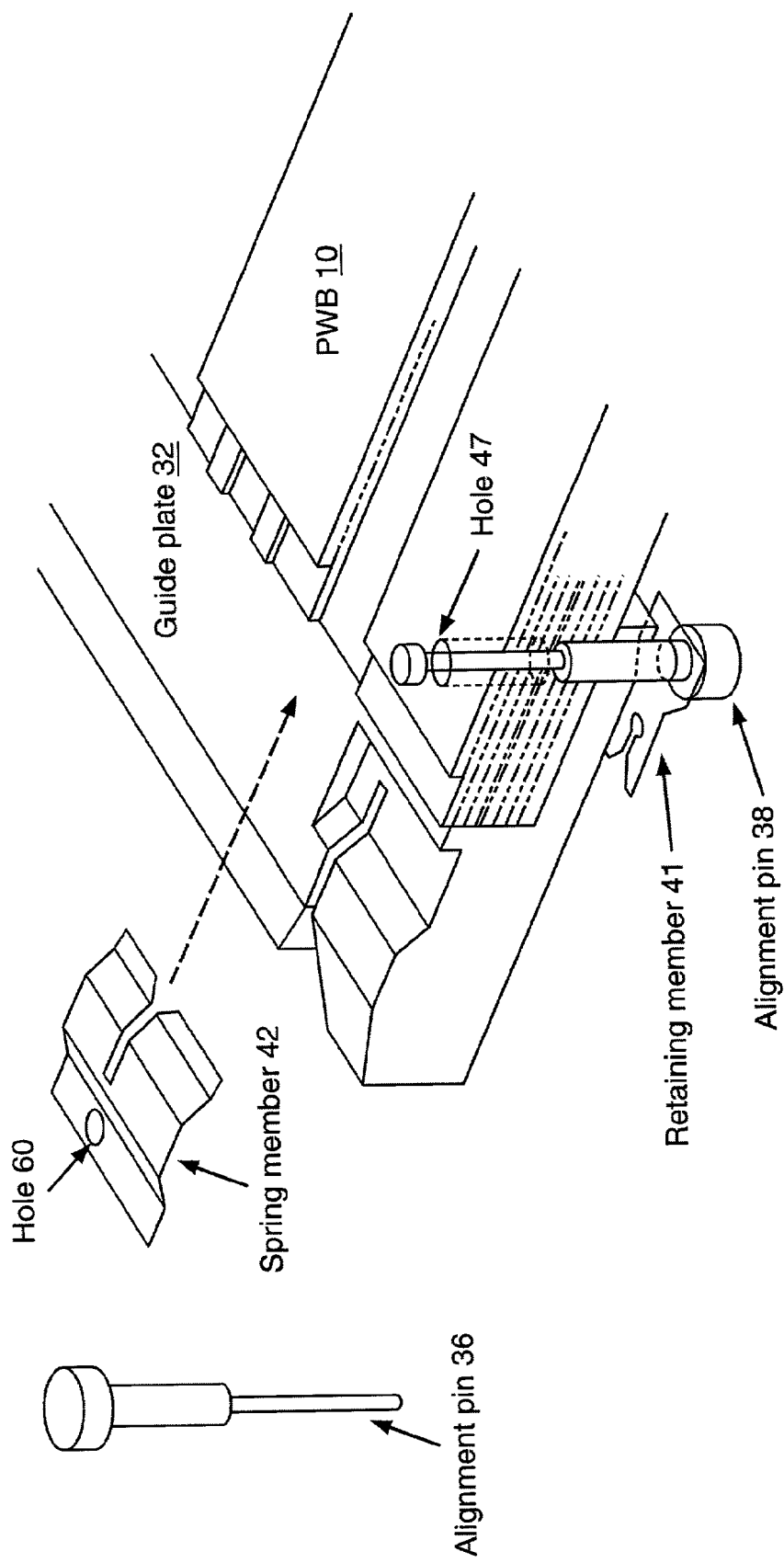

Referring to FIG. 2, electrical connection is established by placing at least a portion of the flat surface of exposed traces 20, 21 (21 not illustrated) in physical contact with corresponding conductors associated with another device. For example, a second printed wiring board 28 with corresponding exposed signal layer traces 30 (other trace not illustrated) may be aligned with and secured against the printed wiring board 10 such that the flat surfaces of the traces, e.g., traces 20 and 30, are maintained in physical contact with one another.

Referring again to FIG. 1, the signal layer traces 20, 21 are exposed by removing material from the outer layer 12, including portions of substrate 24, from above the traces 20, 21. The substrate material can be removed after combining the individual layers of the multilayer printed wiring board by employing destructive techniques such as milling or laser ablation. Milling may be done along the edge of the printed wiring board or across interior portions. Alternatively, the substrate material on one side of the traces may be formed with a perforated or cutaway portion that leaves a portion of the traces exposed when the layers are adhered together. The signal layer traces 20, 21 may alternatively be extended beyond the edge 26 of the other layers for purposes of establishing electrical connection. In particular, either the signal layer traces 20, 21 alone or both the traces 20, 21 and the underlying substrate material 22 may be extended.

Referring to FIGS. 3 through 7, guide plates 32, 34 and alignment pins 36, 38 may be employed to facilitate alignment and connection of the printed wiring boards. The guide plates 32, 34 and alignment pins 36, 38 provide co-lateral and longitudinal alignment. The guide plates 32, 34 may also provide additional stiffness to the substrate and contact pressure between corresponding signal layer traces 20, 30.

Guide plate 32 is formed to receive the edge 26 of printed wiring board 10. In particular, the printed wiring board 10 is seated on a surface 39 formed on the guide plate. Alignment pin 38 is inserted through hole 43 in retaining member 41, and then through hole 45 in the guide plate 32. Alignment pin 38 is also inserted through hole 47 in printed wiring board 10. The holes and alignment pin may be sized to achieve a press fit.

Guide plate 34 is formed to receive printed wiring board 28. In particular, alignment pin 36 is inserted through a hole 60 formed in spring member 42, and then through holes 62, 64 formed in guide plate 34 and printed wiring board 28, respectively. The holes and alignment pin may be sized to achieve a press fit.

Figure 5:
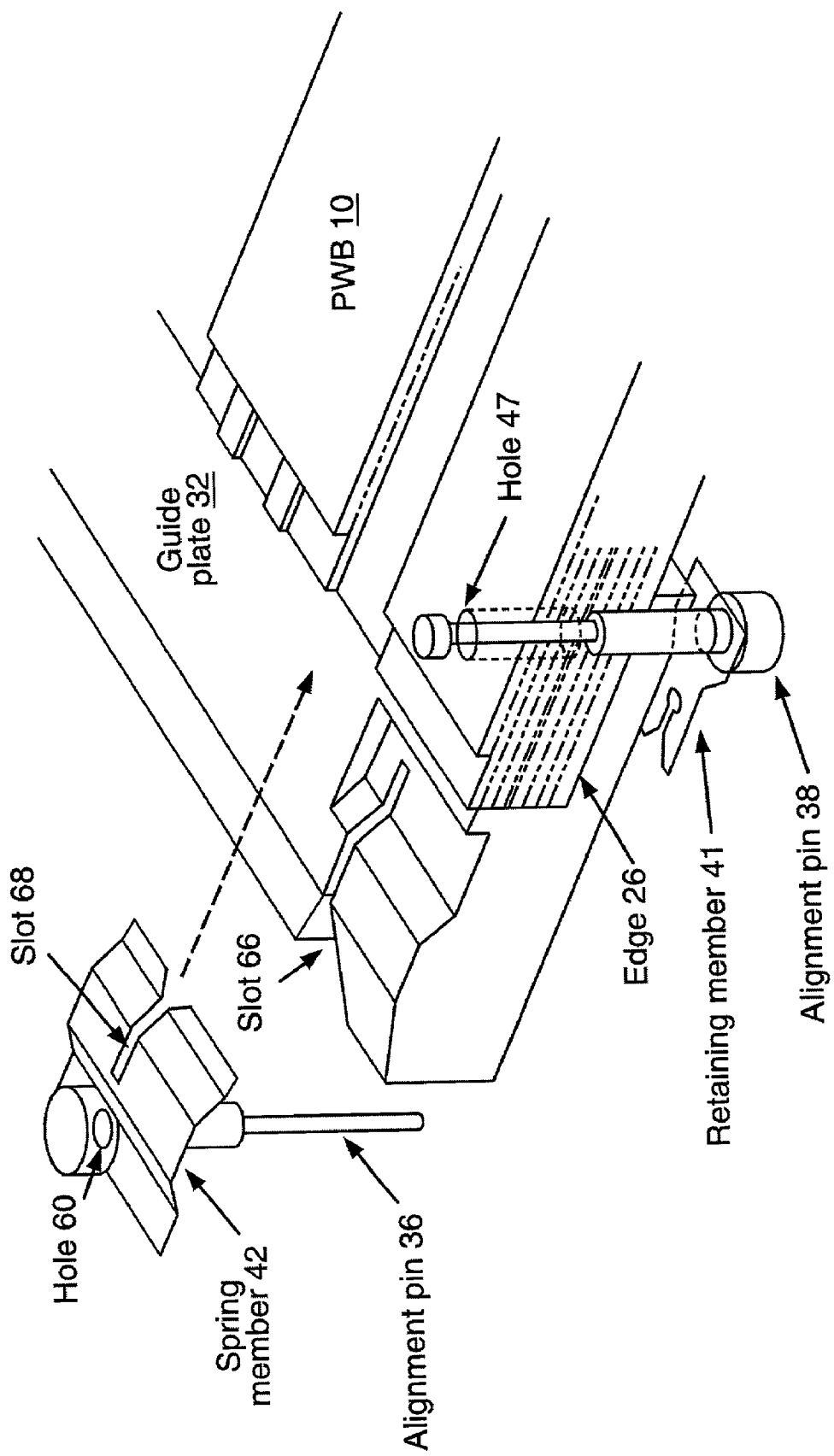
Figure 6:
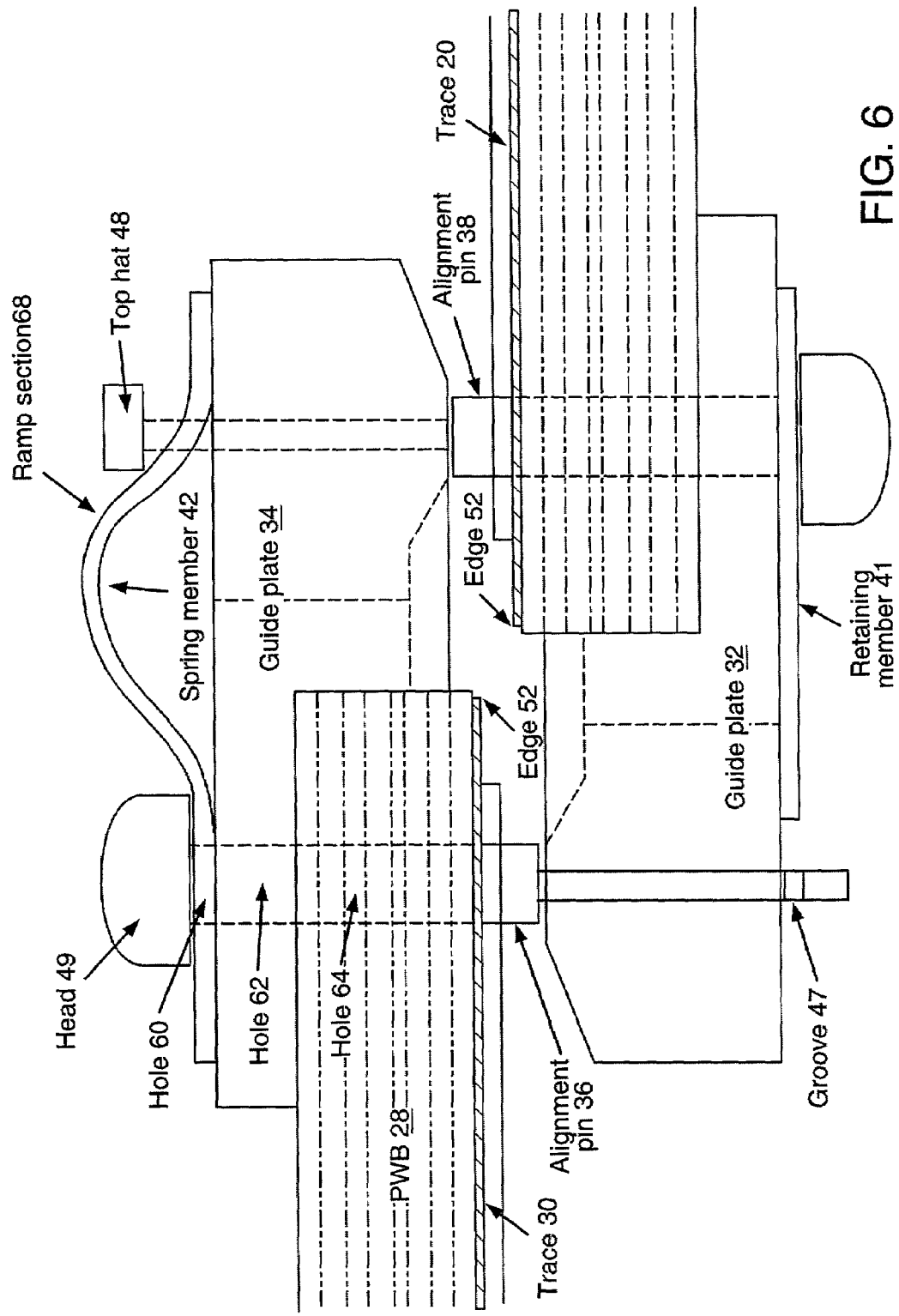
Figure 7:
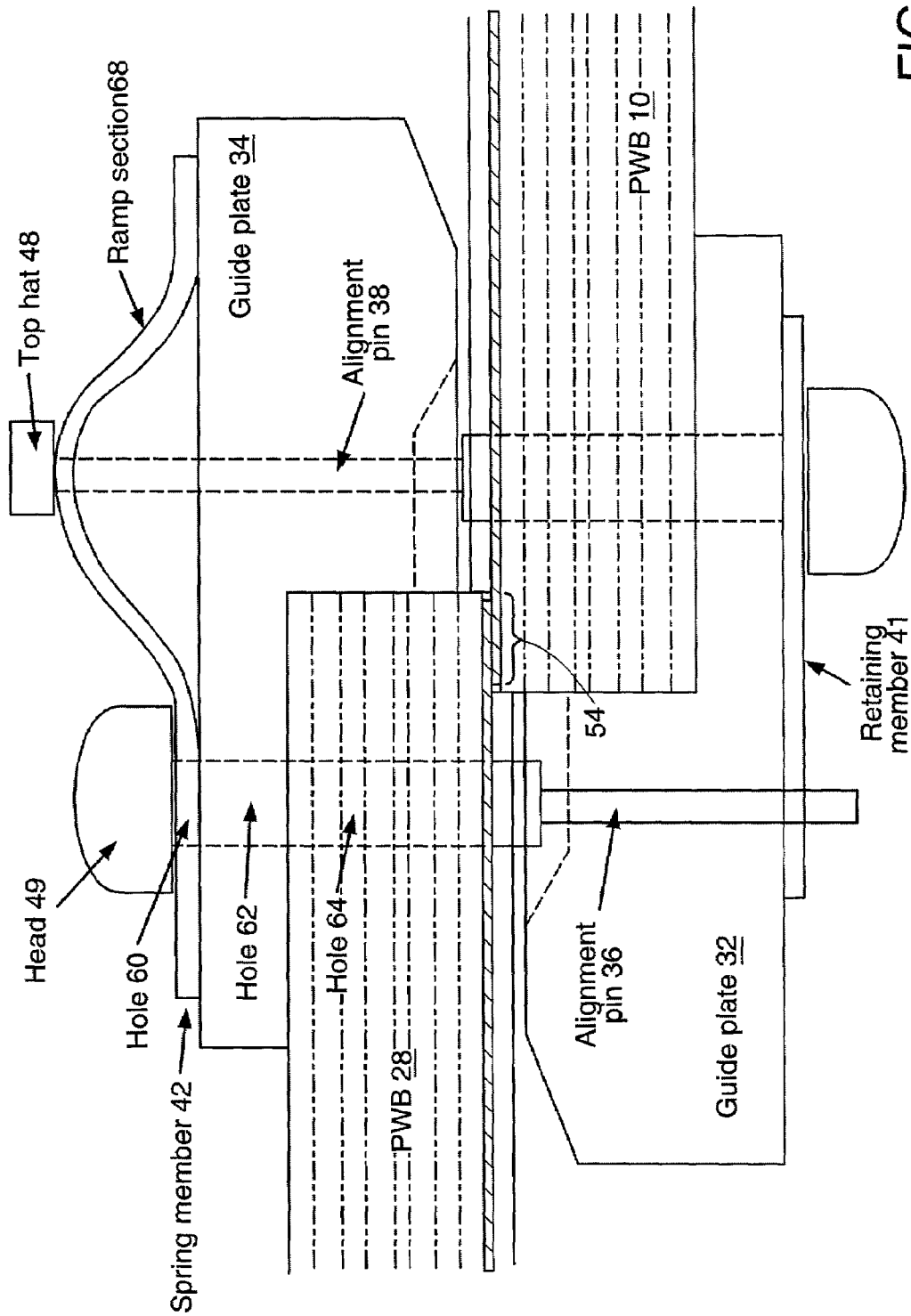

As illustrated in FIGS. 5, 6 and 7, the alignment pins facilitate alignment of the printed wiring boards with respect to the corresponding guide plates. Alignment pin 36 is positioned to engage a corresponding slot 66 formed in guide plate 32. Alignment pin 38 is positioned to engage a similar slot (not illustrated) in guide plate 34. The likelihood of board-to-board misorientation during interconnection is reduced by aligning the two alignment pins with the corresponding slots.

The spring members are employed in connection with the alignment pins, retaining members and guide plates to facilitate establishment and maintenance of electrical interconnection of corresponding traces. The spring member 42 is compressed by top hat 48 during interconnection, providing contact pressure of approximately 45 g per contact. When connection is established, alignment pin 36 is held in position by hole 60 and alignment pin 38 is held in a slot 68 formed in the spring member 42. A ramp section 68 of the spring member 42 formed proximate to the slot 68 causes the spring member 42 to initially engage alignment pin 38 without spring compression. A top hat portion 48 of alignment pin 38 causes spring compression as it traverses the ramp section 68. Retaining member 41 interlocks with a groove 47 in alignment pin 36 to secure it in place. The resulting force is approximately orthogonal to the plane defined by the signal layer 14 and evenly applied across length 54 of the overlapping conductive surfaces.

Referring to FIGS. 6 and 7, the guide plates, alignment pins and spring members facilitate a wiping interaction when corresponding printed wiring boards are engaged. The wiping action facilitates reliable establishment of electrical contact between corresponding conductors. In the illustrated embodiment, alignment pins 36, 38 slide into respective guide plate alignment slots starting at the open edge of the guide plate. The top hat 48 of alignment pin 38 and head 49 of alignment pin 36 are too large to fit inside the alignment slots in the guide plates, thereby preventing direct vertical interconnection of the traces. Instead, spring member 42 forces the traces into contact, starting first at the outer edge 52 of each trace and continuing until contact is established across the entire length 54 of the overlap area.

The printed wiring boards may be modified prior to seating on the guide plate to compensate for typical non-planar characteristics such as mild warping. In particular, the portion of each printed wiring board that seats against the guide plate may be milled to achieve greater planarity. Once seated against the guide plate and secured thereto, the rigidity of the guide plate functions to mitigate any further warping of the printed wiring board.

Referring again to FIG. 1, protrusions 56 may be formed on the signal layer traces 20, 21 to facilitate establishing and maintaining physical contact with corresponding traces. A relatively large array of traces may be employed to interconnect a relatively large number of signals. Normal, non-planar characteristics of printed wiring boards, such as moderate warping, could cause connection difficulties for traces in relatively large arrays. In order to compensate for the non-planar characteristics, malleable or resilient conductive protrusions 56 may be disposed on the surface of traces 20, 21. The protrusions 56 facilitate establishment of electrical connection by deforming slightly against the corresponding trace, e.g., trace 30, during the contact wipe motion described above. Nickel and gold protrusions, for example, may be formed on the copper traces by pre-cleaning the copper surface, applying at least 0.120" of electroless nickel on the copper, and then applying approximately 0.030" electroless gold on the nickel surface. Embodiments of protrusions are described in U.S. Pat. No. 5,101,553, entitled "Method of making a metal-on-elastomer pressure contact connector," which is incorporated by reference.

Figure 8:
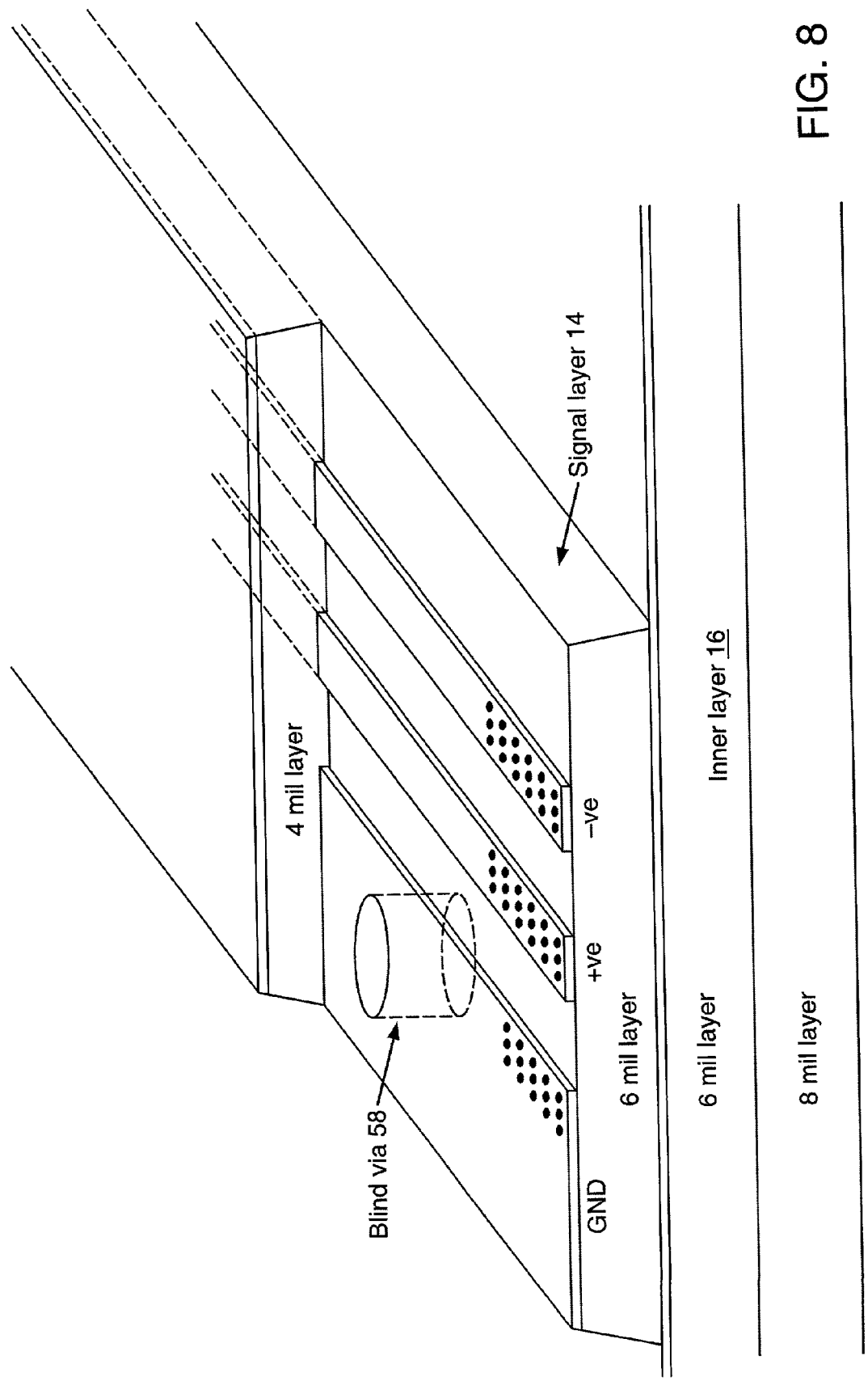
FIG. 8 illustrates routing of a signal from another layer to the signal layer with a blind via.

Referring to FIG. 8, a via can be used to route power, ground and other suitable "signals" to the signal layer for purposes of direct interconnection. In the illustrated embodiment, a blind via 58 is employed to route ground from inner layer 16 to the signal layer 14. In general, vias may be employed to route signals that are not susceptible to the undesirable electrical properties associated with vias. Once routed to a conductive trace on the signal layer, the power, ground or other signals can be routed on the conductive trace to the edge of the printed wiring board for interconnection as already described.

Figure 9:
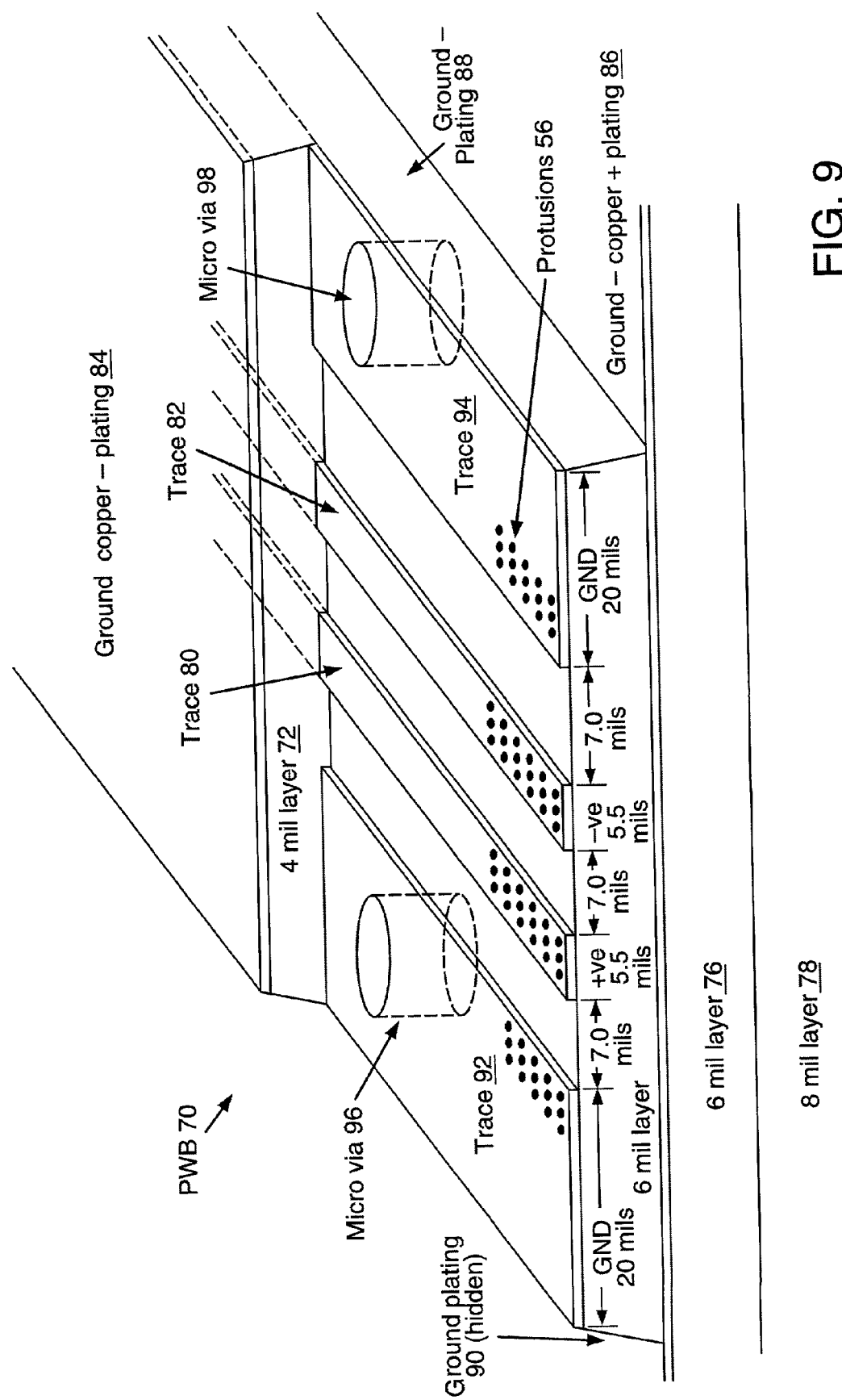
FIG. 9 illustrates shielding of the traces in FIG. 1.

Referring to FIG. 9, traces may be shielded. Printed wiring board 70 includes multiple substrate layers 72, 74, 76, 78. Exposed traces 80, 82 are formed on signal layer 74 in accordance with the techniques described above. Further, shielding is provided by grounded copper plating 84, 86 on layer 72 and layer 76, above and below differential traces. Additional shielding is provided by vertically oriented grounded copper plating 88, 90. Finally, grounded copper traces 92, 94 are disposed on substrate 74 on both sides of the traces 80, 82, by employing micro vias 96, 98 as described with regard to FIG. 8. The traces 80, 82 may be augmented with protrusions 56.

Figure 10:
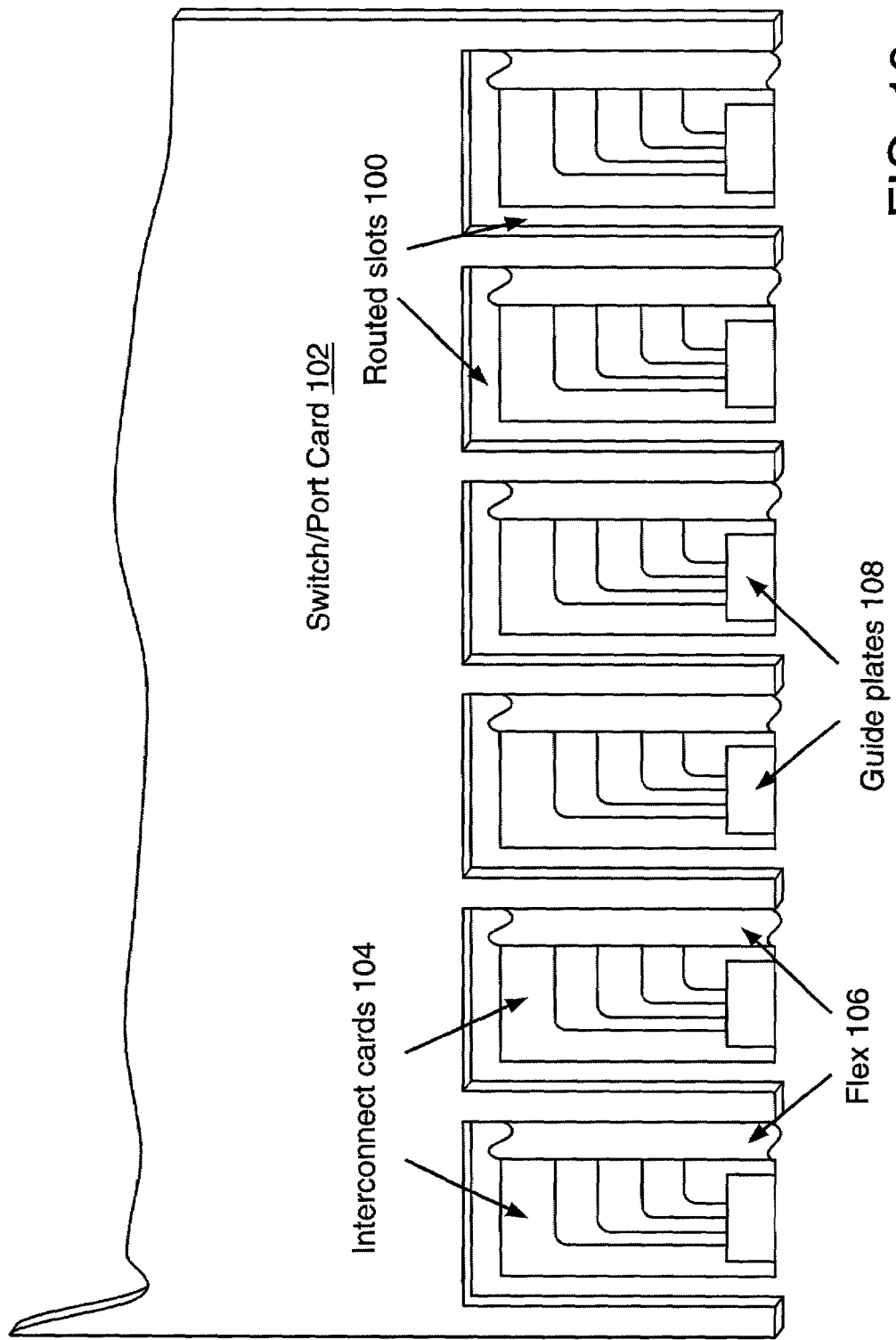
FIGS. 10 through 12 illustrate use of the interconnects in combination with flexible substrates to achieve different interconnect geometries.
Figure 11:
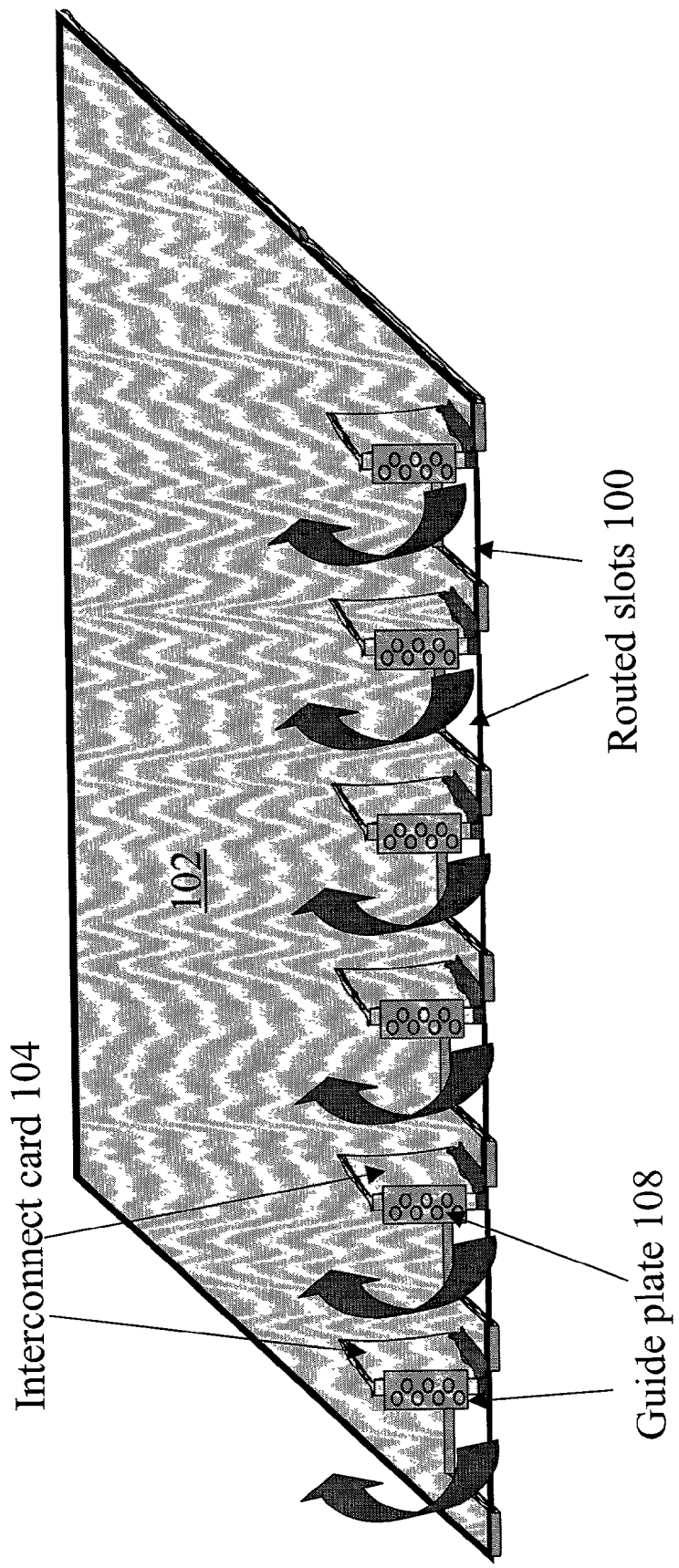
Figure 12:
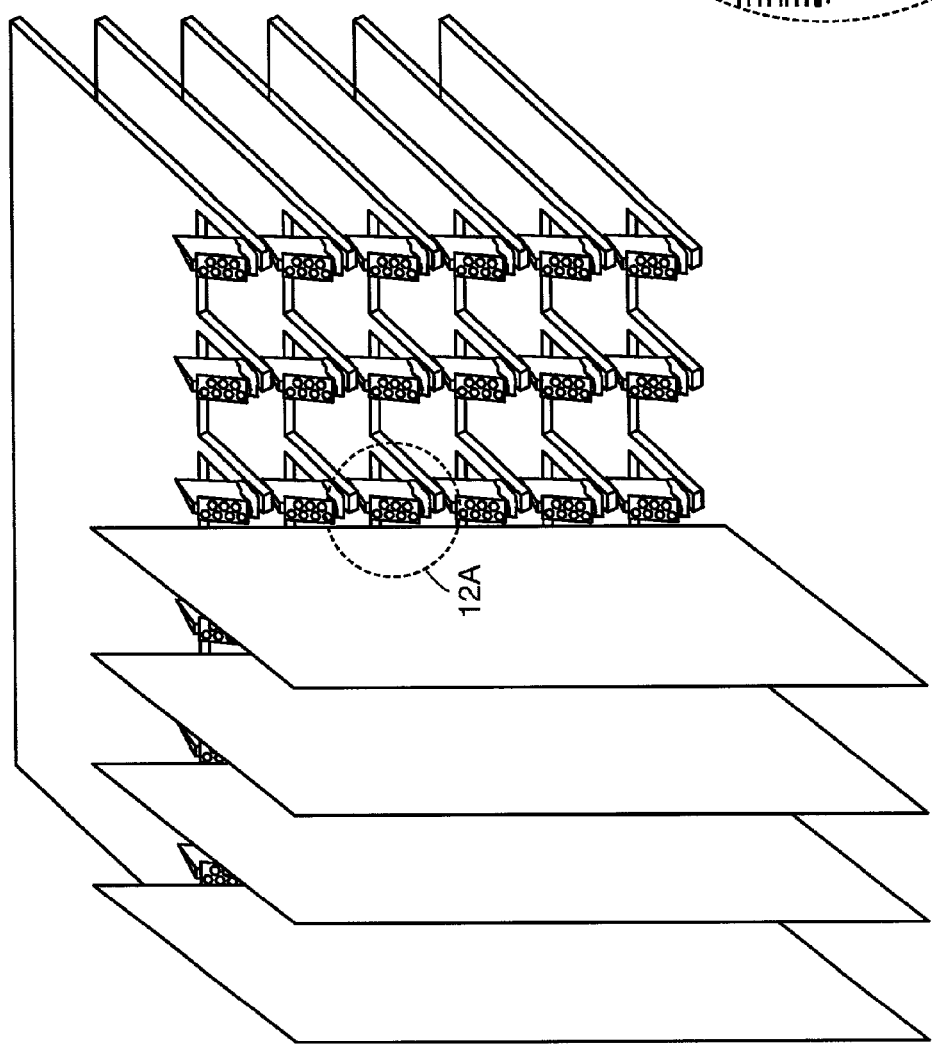
Figure 12A:
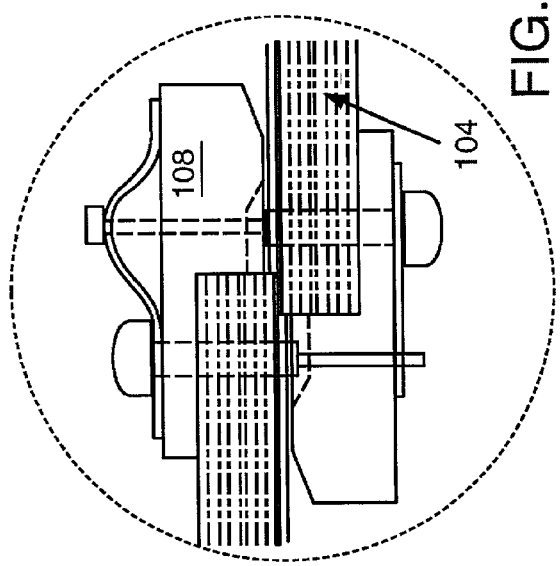

As illustrated in FIGS. 10, 11, and 12, the present invention may be employed to facilitate establishment of interconnection with out-of-plane and non-parallel printed wring boards. Slots 100 are formed along an edge of a main printed wiring board 102. An interconnect card 104 is mounted in each slot 100. In particular, traces disposed near the edge of the interconnect card are connected with corresponding traces on the main printed wiring board through flex-substrate boards 106. A guide plate 108 is mounted on one edge of each interconnect card 104 with alignment pins as previously described. To achieve a 90 degree interconnect offset, each interconnect card 104 is pivoted 90 degrees by inducing a bend in the flex-substrate board 106 that connects with the main board 102. As illustrated in FIG. 13, the guide plates 108, alignment pins and retaining members are then employed as described above to establish electrical connection between printed wiring boards. The illustrated embodiment utilizes the present invention to provide a multi-card device without need of a backplane The present invention is not to be limited in scope by the specific embodiments described herein. Indeed, various modifications of the present invention, in addition to those described herein, will be apparent to those of ordinary skill in the art from the foregoing description and accompanying drawings. Thus, such modifications are intended to fall within the scope of the following appended claims. Further, although the present invention has been described herein in the context of a particular implementation in a particular environment for a particular purpose, those of ordinary skill in the art will recognize that its usefulness is not limited thereto and that the present invention can be beneficially implemented in any number of environments for any number of purposes.

Accordingly, the claims set forth below should be construed in view of the full breadth and spirit of the present invention as disclosed herein.

What is claimed is:

1. An interconnection device comprising:
   first and second outer layers, each including substrate material;
   at least one inner layer disposed between said first and second outer layers, said inner layer including at least one conductive signal trace disposed on a rigid substrate material proximate to an edge of the interconnection device and being accessible for direct electrical connection with a corresponding exposed signal trace, wherein at least one conductive protrusion is formed on said conductive inner layer trace, and wherein said protrusion is resilient; and
   shielding disposed around the at least one signal trace, including a first shielding wall on a layer below the trace, a second shielding wall on a layer above the trace, and third and fourth shielding walls on either side of the trace, the first, second, third and fourth shielding walls being connected such that uninterrupted shielding is provided for 360° around the trace.

2. The interconnection device of claim 1 wherein said conductive inner layer trace extends outward from the edge of the interconnection device.

3. The interconnection device of claim 1 wherein at least a portion of said first outer layer is removed to provide access to said conductive inner layer trace.

4. The interconnection device of claim 1 wherein said protrusion is malleable.

5. The interconnection device of claim 1 wherein said inner layer substrate material is organic.

6. An interconnection device comprising:

a printed circuit board having first and second outer layers, each including substrate material;

at least one inner layer disposed between said first and second outer layers, said inner layer including at least one conductive signal trace disposed on substrate material proximate to an edge of the interconnection device and being accessible for direct electrical connection with a corresponding signal trace, wherein at least one conductive protrusion is formed on said at least one conductive signal trace, and wherein said protrusion is resilient, and wherein said inner layer substrate material is a ceramic; and shielding disposed around the at least one signal trace, including a first shielding wall on a layer below the trace, a second shielding wall on a layer above the trace, and third and fourth shielding walls on either side of the trace, the first, second, third and fourth shielding walls being connected such that uninterrupted shielding is provided for 360° around the trace.

7. The interconnection device of claim 6 wherein said conductive inner layer trace extends outward from the edge of the interconnection device.

8. The interconnection device of claim 6 wherein at least a portion of said first outer layer is removed to provide access to said conductive inner layer trace.

9. The interconnection device of claim 6 wherein at least one conductive protrusion is formed on said conductive inner layer trace.

10. The interconnection device of claim 9 wherein said protrusion is malleable.

11. An interconnection device comprising:

first and second outer layers, each including substrate material;

at least one inner layer disposed between said first and second outer layers, said inner layer including at least one conductive signal trace disposed on a rigid substrate material proximate to an edge of the interconnection device and being accessible for direct electrical connection with a corresponding exposed signal trace, wherein at least one conductive protrusion is formed on said conductive inner layer trace, and wherein said protrusion is malleable; and shielding disposed around the at least one signal trace, including a first shielding wall on a layer below the trace, a second shielding wall on a layer above the trace, and third and fourth shielding walls on either side of the trace, the first, second, third and fourth shielding walls being connected such that uninterrupted shielding is provided for 360° around the trace.

12. An interconnection device comprising:

a printed circuit board having first and second outer layers, each including substrate material;

at least one inner layer disposed between said first and second outer layers, said inner layer including at least one conductive signal trace disposed on substrate material proximate to an edge of the interconnection device and being accessible for direct electrical connection with a corresponding signal trace, wherein at least one conductive protrusion is formed on said at least one conductive signal trace, and wherein said protrusion is malleable, and wherein said inner layer substrate material is a ceramic; and shielding disposed around the at least one signal trace, including a first shielding wall on a layer below the trace, a second shielding wall on a layer above the trace, and third and fourth shielding walls on either side of the trace, the first, second, third and fourth shielding walls being connected such that uninterrupted shielding is provided for 360° around the trace.

\* \* \* \* \*